United States Patent [19]
Kita et al.

[11] Patent Number: 4,766,993
[45] Date of Patent: Aug. 30, 1988

[54] CONVEYING APPARATUS

[75] Inventors: Tadae Kita; Akihiro Okuno, both of Kawasaki, Japan

[73] Assignee: Fuji Electric Co., Ltd., Kawasaki, Japan

[21] Appl. No.: 929,594

[22] Filed: Nov. 10, 1986

[30] Foreign Application Priority Data

Nov. 13, 1985 [JP] Japan .................................. 60-254187

[51] Int. Cl.$^4$ .............................................. B65G 35/00
[52] U.S. Cl. ..................................... 198/619; 104/165; 104/281
[58] Field of Search ................. 198/619; 104/165, 281

[56] References Cited

U.S. PATENT DOCUMENTS 4,392,435  7/1983  Moody et al. ................... 104/281 X
4,540,326  9/1985  Southworth et al. .......... 198/619 X

FOREIGN PATENT DOCUMENTS 57-52149  3/1982  Japan .................................... 198/619

Primary Examiner—Robert J. Spar
Assistant Examiner—Cheryl L. Gastineau
Attorney, Agent, or Firm—Bruce L. Birchard

[57] ABSTRACT

There is provided specialized conveying apparatus for transporting articles which are confined to a tube or chamber within which the cleanliness is maintained at extremely high levels by utilizing existing precipitator and other apparatus, the motion of the pallet on which the articles to be processed are carried being produced by a motor-driven truck which is isolated pneumatically from the article-carrying pallet but which is coupled magnetically to elements on that pallet so that the pallet is levitated in the controlled atmosphere and caused to move by the moving of a truck in the isolated driver portion of the apparatus, all of the dust and other contaminants which are produced in the frictional process of driving the truck being isolated from the clean chamber in which the article is being processed by reason of a nonmagnetic wall separating the driver portion from the conveying portion of the apparatus, the result being the ability to obtain previously unachievable, high levels of cleanliness in the clean chamber.

5 Claims, 2 Drawing Sheets

CONVEYING APPARATUS

BACKGROUND OF THE INVENTION

1. Field of the Invention

This invention relates to article conveying apparatus and more particularly to such apparatus for use in highly-demanding production environments.

2. Prior Art

Today in the fields of semiconductor manufacture and in bio-technology it is necessary to convey components or completed articles in a space which is highly controlled as to particulate matter in the atmosphere within the space. In the prior art, with conveying apparatus the objects to be conveyed were placed on a conveying pallet which was moved within a space having an atmosphere that was highly purified. The transport was effected by means of wheels or sliding guides mounted directly on the pallet which held the article to be conveyed. Wheels and sliding guides produce dust particles and even though they are few in number and small in size they cannot be accepted in the modern-day production environments, particularly for semiconductor devices and bio-technology products, for example. Many attempts have been made to improve the materials of the wheels and the sliding guides to reduce friction and the consequent generation of particulate matter and, while some progress has been made in this area, that progress has been inadequate and, until the conception of this invention, the desires of the manufacturers in the highly precise and demanding production fields have not been met.

Therefore, it is an object of the present invention to provide conveying apparatus which will permit the movement of the article to be conveyed in a dust-free environment, assuring that no dust will be generated in the process of moving the article.

SUMMARY OF THE INVENTION

A tube or tunnel in which the atmosphere can be purified to the absolute degree desired is provided with a pallet on which the article to be conveyed is carried. The pallet carries at its opposite ends vertically disposed permanent magnets or iron cores. Outside of the tube or controlled atmosphere chamber a truck is provided which has motor-driven wheels riding on or in guides so that the truck may move through the conveying apparatus but outside of the controlled-atmosphere chamber. The truck carries electromagnets the poles of which face the poles carried by the pallet in the controlled atmosphere chamber and the current flowing through the excitation coils of the electromagnets in the truck\portion of the apparatus is controlled so that the pallet carrying the articles to transported is levitated in the controlled atmosphere chamber or tube. Further, as the truck moves the levitated pallet moves in unison with the truck by reason of the magnetic coupling between the electromagnets carried by the truck and the magnets or cores carried by the pallet. Any dust that is produced by the wheels or motor in the truck portion cannot enter the controlled atmosphere chamber where the article being conveyed is present because of the non-magnetic wall that separates the truck portion of the apparatus from the pallet portion of the apparatus. The degree of purification which thus be achieved in the controlled atmosphere chamber of this apparatus is extremely high being below 10 class compared with at best a 500-1000 class that conventional conveyor systems can provide.

BRIEF DESCRIPTION OF THE DRAWINGS

This invention can best be understood by the description in the specification taken in conjunction with the drawings herein, in which.

DETAILED DESCRIPTION OF THE PREFERRED EMBODIMENTS

Figures 1A, 1B:
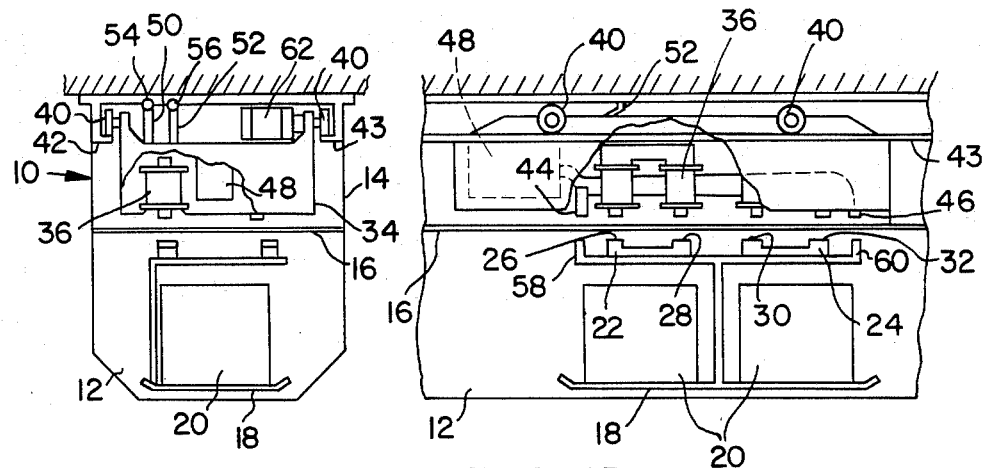
FIG. 1A is an end view of a schematic representation of one embodiment of the present invention.
FIG. 1B is a side-elevation view, in schematic form, of the apparatus of FIG. 1A.

In FIGS. 1A and 1B conveying apparatus 10 includes a controlled atmosphere tube or chamber 12 and a drive chamber 14 with a common partition 16 of non-magnetic material separating the drive chamber 14 from controlled atmosphere chamber 12. Partition 16 may be of a plastic material but, in any event, must be non-magnetic in character. As has been indicated, controlled atmosphere chamber 12 has an atmosphere which is highly controlled by atmosphere control equipment not shown. Such atmosphere control equipment, including precipitators, are well known and need not be described here. A pallet 18 is disposed in controlled atmosphere chamber 12 for supporting articles 20 to be transported. Soft iron pole pieces 22 and 24, which may in fact be ferrite magnets properly poled, are fixedly secured to pallet 18 so that those pole pieces or magnets have their principal magnetic surfaces 26, 28, 30 and 32, respectively, facing partition 16.

In this embodiment, drive chamber 14 is disposed outside of controlled atmosphere chamber 12 and above it. Drive chamber 14 includes a truck 34 carrying thereon in fixed relationship thereto electromagnets 36. Truck 34 has wheels 40 and rails 42 and 43 on which those wheels move. Truck 34 also carries proximity sensors 44 and 46 which are coupled to electromagnet control apparatus 48 to effect control of the levitation of pallet 18, as will be described more fully hereinafter. Power to operate the motor and of the apparatus in drive chamber 14 is accomplished by means of current collectors 50 and 52 which move along powered rails 54 and 56 as truck 34 moves.

The apparatus of FIGS. 1A and 1B operates as follows. Objects 20 to be transported are placed on pallet 18 and then electromagnets 36 are energized by way of electromagnet control apparatus 48. Electromagnets 36 attract pole pieces or magnets 22 and 24 through partition 16 which is non-magnetic in character. As a result of the magnetic attraction that occurs, pallet 18 is caused to levitate in cleanchamber 12. Proximity detectors 44 and 46 detect the spacing between the ends 58 and 60 and the sensing elements 44 and 46 and the amount of that spacing can be adjusted by means of electromagnet control 48 to maintain a desired gap between the pallet ends and the sensors with an attendant control of the position of levitation of pallet 18 in chamber 12. Once pallet 18 is levitated to the desired degree truck 34 may be activated by turning on the power to drive motor 62 through a switch, not shown.

Because of the high degree of separation between the controlled atmosphere of chamber 12 and the drive chamber 14 one does not have to be particularly careful about keeping down the level of dust produced by the drive mechanism in the truck 34. While the embodiment of FIGS. 1A and 1B shows the conveying apparatus 10 supported from a ceiling with truck 34 moving along that ceiling it is possible to invert the apparatus and have the truck moving along a ground plane with the pallet moving above it.

If drive chamber 14 is mounted in a clean room a separate controlled atmosphere chamber 12 may not be needed as long as drive chamber 14 is enclosed. The same magnetic principles described in connection with FIGS. 1A and 1B may be applied.

The embodiment of FIGS. 1A and 1B is particularly suitable for use in installations where the object to be conveyed can be conveyed proximate to the ceiling of a building. However, in the case where the objects are to be conveyed near the floor or near fabricating equipment, because the objects to be conveyed are positioned beneath the truck 34, handling and observation of the objects to be conveyed is very difficult.

Figure 2:
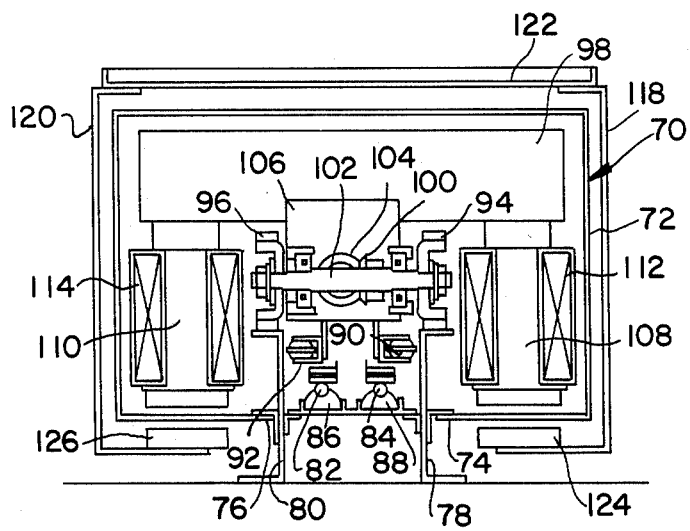
FIG. 2 is a side elevation view, partially schematic in nature, which shows a second embodiment of the present invention.
Figure 3:
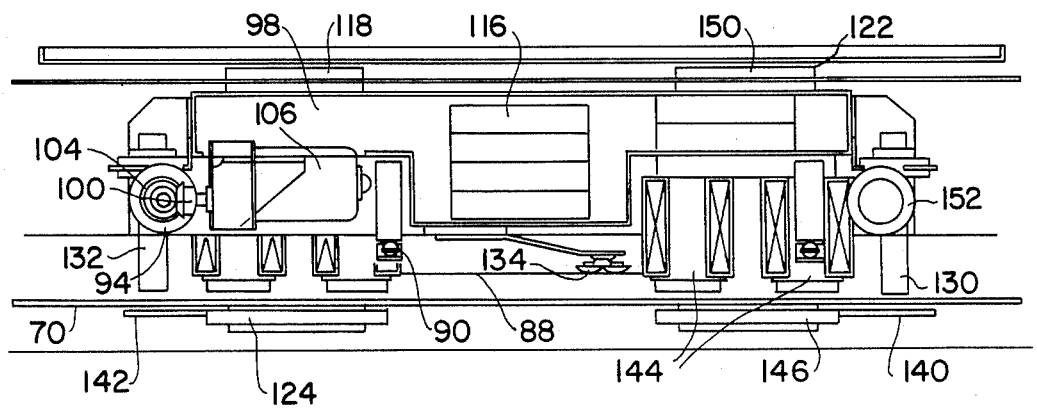
FIG. 3 is a bottom view of the apparatus shown in FIG. 2.
Figure 4:
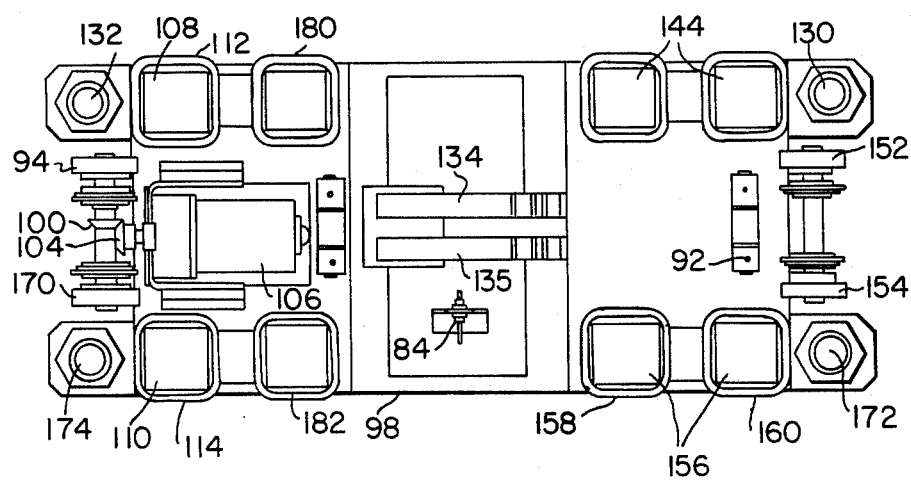
FIG. 4 is an end-elevation view of the apparatus of FIG. 2.

To solve that problem the embodiment of FIGS. 2-4 has been provided. In FIG. 2 drive chamber 70 includes a transparent, non-magnetic tube or sleeve 72 which is supported at its extremities 74 and 76 from tracks 78 and 80, respectively. Tracks 78 and 80 are centrally disposed with respect to tube or sleeve 72, as shown. Power lines 82 and 84 are supported from tracks 78 and 80 by way of insulators 86 and 88. Guide wheels 90 and 92 ride on the sides of tracks 78 and 80, respectively. At the same time transport wheels 94 and 96 ride on the top of tracks 78 and 80, respectively. These wheels are all attached to track 98. A geneva gear 100 is carried by shaft 102 (which carries wheels 94 and 96) and is in enmeshing engagement with geneva gear 104 on the shaft of motor 106 for causing the movement of truck 98. Magnetic cores 108 and 110 are suspended from truck 98 and have electromagnet coils 112 and 114, respectively, wound about them. Coils 112 and 114 on cores 108, 110, respectively, are mounted on truck 98 at two of the corners thereof and another set of corresponding combinations of cores and coils are mounted on the remaining corners of truck 98. As can be seen in FIG. 3 truck 98 also carries electromagnet control apparatus 116. A load supporting yoke comprising arms 118 and 120 is supported from pallet 122 and encompasses tube or shell 70. Yoke arms 118 and 120 are made of a non-magnetic material and carry at their lower extremities cores or appropriately poled magnets 124 and 126. These cores or magnets 124 and 126, which are movable with pallet 122, are positioned opposite cores 108, 110, with corresponding combinations of cores or magnets attached to pallet 122 and electro-magnets at the remaining corners of truck 98, those electromagnets not being shown in FIG. 2, but appearing in FIG. 4. Yoke arms 118 and 120, in addition to being non-magnetic, are transparent. This permits viewing of the operation of the apparatus more easily.

In order to control the levitation of pallet 122 there are provided gap sensors 130 and 132 which are visible in FIG. 3. These gap sensors are electrically coupled to electromagnet apparatus control 116 by wires, not shown.

In FIG. 3 certain elements are more clearly set forth than in earlier Figs. Gap sensors 130 and 132 cooperate with tabs 140 and 142, respectively, in cooperation with electromagnet control apparatus 116, to detect the gap between the sensor elements and the tabs so that electromagnet control apparatus 116 may accurately set the gap between cores 144 supported from truck 98 and its associated core 146 carried by pallet 122. This same phenomenon occurs at all four corners of truck 98. Yoke element 150 corresponds to yoke element 118 in this case supporting iron core or magnet element 146. Current to operate the electromagnet control apparatus passes to those elements by way of current collector 134 from power line 88. When power is applied to truck 98, the current flowing through the electromagnets causes those electromagnets to attract the cores or magnets such as elements 124 and 146, thus raising pallet 122 so that it may levitate and be moved as truck 98, carrying electromagnets, moves.

In the bottom view of FIG. 4 all four gap sensors 130, 132, 172 and 174 may be seen. Also, all of the truck wheels 152, 154, 94 and 170 are visible. The current collectors 134 and 135 are also visible as is one of the current-carrying wires 84. All of the electromagnet cores 108, 110, 144 and 156 are also visible. The remaining electromagnet windings 180 and 182 may also be seen. These are all carried by truck 98.

Thus there has been provided by this invention conveying apparatus which is particularly adapted to high precision manufacturing, as in the semiconductor and bio-technology fields and which in the chamber where the actual delicate process is being conducted no dust, whatsoever, is generated because the pallet carrying the product on which operations are to occur is levitated and moved by magnetic means without any frictional contact whatsoever. All of the frictional forces and other sources of generating dust are confined to the drive portion of the apparatus which is isolated pneumatically from the clean area but is coupled magnetically between cooperating elements in the driver and clean or controlled atmosphere portions of the apparatus. As a consequence, with the present invention, cleanliness of below 10 class can be obtained compared with 1000-500 class which is the best that can be obtained with conventional systems.

While particular embodiments have been shown and described it will be apparent to those ordinarily skilled in the art that certain variations and modifications may be made in the disclosed structure without departing from the spirit and scope of the invention. It is the purpose of the appended claims to cover all such variations and modifications.

What is claimed is:

1. Conveying apparatus for dust-sensitive articles including:
   a driving section and a conveying section;
   said driving section including a pair of parallel track members, a truck portion including wheels engaging said track members and movable therealong and a non-magnetic retangular sleeve encompassing said truck portion and supported at its extremities from respective ones of said track members;
   said conveying section including a pallet portion and a pair of yoke arms extending from opposite sides of said pallet around opposite sides of said non-magnetic rectangular sleeve and terminating below said sleeve in horizontal arm portions parallel to the bottom of said sleeve, said conveying section being movable with respect to said sleeve in the direction of the axis of said sleeve;

magnetic elements carried by said horizontal arm portions near the extremities thereof;

said truck portion carrying electromagnetic elements positioned, in operation, opposite said magnetic elements carried by said horizontal arm portions;

said magnetic elements and said electromagnetic elements being poled and operated in the attraction mode;

said truck portion including, in addition, an electrical motor coupled to said wheels for moving said truck along said track elements and magnetic control means for controlling the levitation of said conveying section with respect to said non-magnetic, rectangular sleeve;

and means for applying electrical current to said driving section for operation of said conveying apparatus.

2. Apparatus according to claim 1 in which said magnetic control means includes a pair of gap sensor means each having a portion carried by said driving section and a cooperating portion carried by a respective one of said horizontal arm portions.

3. Apparatus according to claim 2 in which said yoke arms are transparent.

4. Apparatus according to claim 1 in which said non-magnetic, rectangular sleeve is transparent.

5. Apparatus according to claim 1 in which said magnetic elements are permanent magnets poled to attract said electromagnetic elements carried by said truck portion.

* * * * *